(12) United States Patent
Goetz

(10) Patent No.: US 8,373,967 B2
(45) Date of Patent: Feb. 12, 2013

(54) HIGH-SPEED DIFFERENTIAL AC COUPLING DEVICE

(75) Inventor: Hans-Joachim Goetz, Neurnberg (DE)

(73) Assignee: Alcatel Lucent, Paris (FR)

( * ) Notice: Subject to any disclaimer, the term of this patent is extended or adjusted under 35 U.S.C. 154(b) by 1794 days.

(21) Appl. No.: 11/392,459

(22) Filed: Mar. 29, 2006

(65) Prior Publication Data

US 2007/0236864 A1    Oct. 11, 2007

(51) Int. Cl.
*H01G 4/06* (2006.01)
*G06F 13/42* (2006.01)

(52) U.S. Cl. ............... 361/321.1; 361/321.2; 361/306.1; 361/277; 361/287; 370/445; 710/106; 333/12

(58) Field of Classification Search ............... 710/106; 361/306.1–306.2, 277, 287, 321.1–321.2; 333/12
See application file for complete search history.

(56) References Cited

U.S. PATENT DOCUMENTS

| | | | | |
|---|---|---|---|---|
| 6,714,558 B1* | 3/2004 | Patel et al. | ..................... | 370/445 |
| 6,749,444 B2* | 6/2004 | Murr et al. | ...................... | 439/79 |
| 6,981,883 B2* | 1/2006 | Raistrick et al. | ................ | 439/74 |
| 7,027,289 B2* | 4/2006 | He et al. | ..................... | 361/306.2 |
| 7,123,466 B2* | 10/2006 | He et al. | ..................... | 361/306.2 |
| 7,154,126 B2* | 12/2006 | Aruga et al. | .................... | 257/98 |

OTHER PUBLICATIONS

Intel—10 Gigabit Ethernet Technology Overview—Apr. 2003—12 Pages.*
Reducing EMI/RFI Susceptibility—Oct. 2003—4 pages.*

* cited by examiner

*Primary Examiner* — Brian Misiura
(74) *Attorney, Agent, or Firm* — Wall & Tong, LLP

(57) ABSTRACT

The present invention includes method and apparatus for a device including two capacitors separated by a gap within one package thereby the two capacitors are coupled to each other in such a way that the impedance between them are matched with respect to the other components along a transmission path.

20 Claims, 3 Drawing Sheets

100

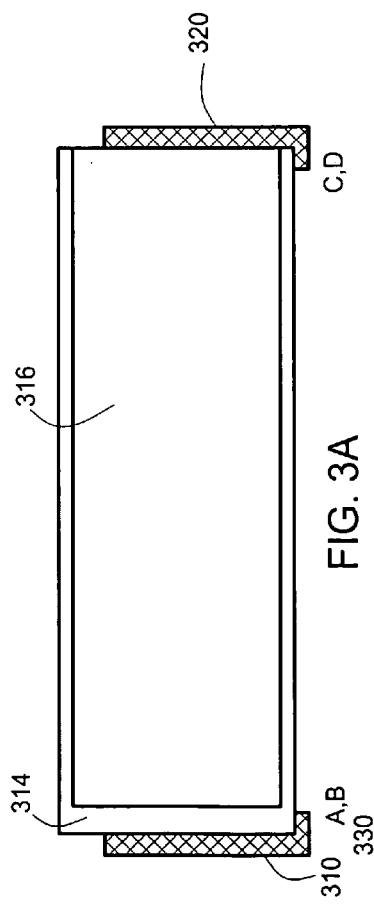
FIG. 3A
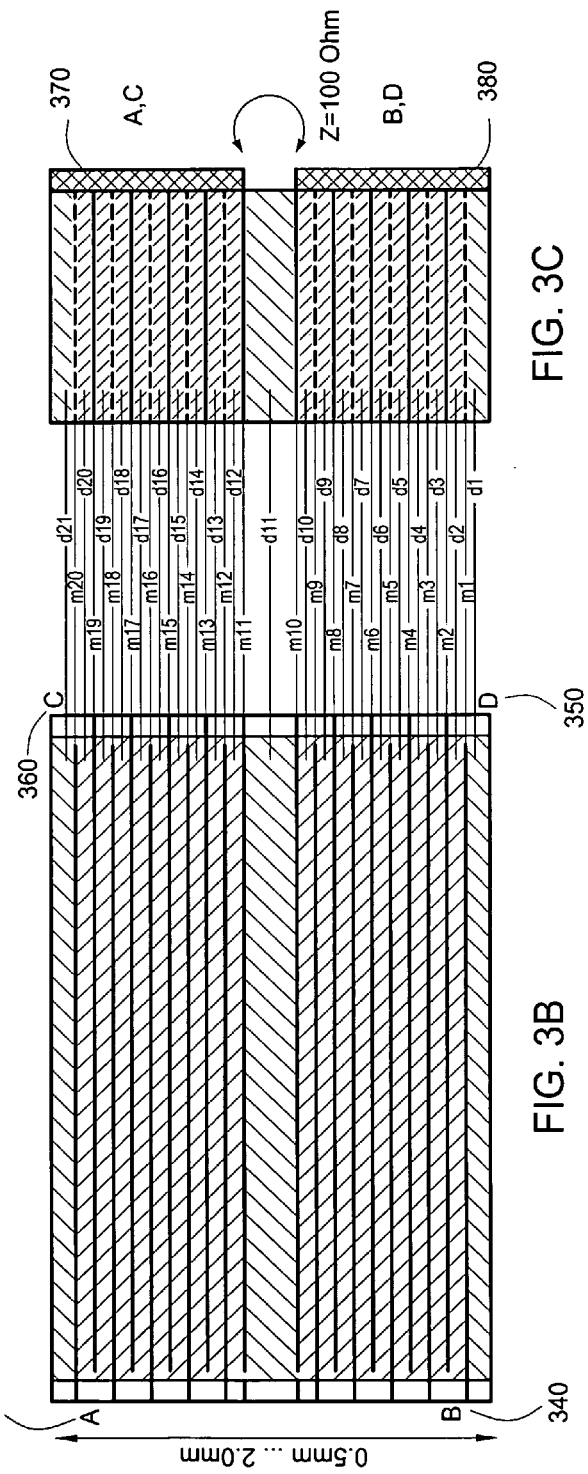
FIG. 3B
FIG. 3C

US 8,373,967 B2

HIGH-SPEED DIFFERENTIAL AC COUPLING DEVICE

FIELD OF THE INVENTION

The invention is related to the field of electrical high-speed interconnects and, in particular, to passive microwave devices.

BACKGROUND OF THE INVENTION

In conventional high-speed point-to-point differential links of 2.5 GBits/s, AC couplers connect devices with different termination voltages. Tiny capacitors function as AC couplers and are added to the connections when required. Conventional technology includes devices that have a termination voltage of 1.8V. However, newer devices have differential voltages such as 1.5 V or 1.2 V. In the future, termination voltage is expected to be even lower, e.g., 1.0V or 0.8V. At 2.5 GBits/s, it is still technically feasible to use tiny capacitors directly on the Printed Circuit Board (PCB). At increased speeds of 3.125 GBit/s, 10 GBit/s or more, signal conditions get progressively worse because discrete coupling capacitors between differential connections cause increased reflections at higher speeds. At 10 Gbit/s or higher, discrete coupling capacitors will be practically unusable.

SUMMARY

Various deficiencies of the prior art are addressed by the present invention of a package containing AC coupling devices for high-speed differential interconnects. The present invention includes method and apparatus for a device including two capacitors within one package thereby the capacitors are coupled to each other in such a way that the line impedance of the differential links is matched.

In accordance with one embodiment of the invention, a passive microwave device in connection with a differential communication link includes a package having two capacitors. The two capacitors are coupled in such a way that the capacitors are part of a differential transmission line with a differential impedance equal to the impedance of the other components of the differential communication link.

In accordance with another embodiment, the present invention includes a printed circuit board (PCB) having a high-speed differential AC coupling device. This embodiment also includes a transmitting device that sends a differential signal, a backplane having traces for transmitting the signal and a receiving device that receives the signal. The AC coupling device has a differential impedance substantially the same as the traces.

In accordance with a further embodiment, the present invention includes connecting a high-speed AC coupler between a transmitting device and a receiving device for transmission of differential signals along a differential transmission link. An impedance of the AC coupler is matched such that the impedance is substantially the same as the impedance of the rest of the differential transmission link. A high-speed differential signal is transmitted from the transmitting device to the receiving device.

The invention further provides other methods and system elements that implement various aspects, embodiments, and features of the invention, as described in further detail below. The foregoing, together with other aspects of this invention, will become more apparent when referring to the following specification, claims, and accompanying drawings.

BRIEF DESCRIPTION OF THE DRAWINGS

The teachings of the present invention can be readily understood by considering the following detailed description in conjunction with the accompanying drawings, in which:

FIGS. 3(a), 3(b) and 3(c) depict the side, top and front views, respectively, of a high-level block diagram of a package of the present invention having high coupling capacitance.

However, the appended drawings illustrate only exemplary embodiments of this invention and are, therefore, not to be considered limiting of its scope, for the invention admits to other equally effective embodiments.

DETAILED DESCRIPTION OF THE INVENTION

The present invention is generally described within the context of passive microwave devices. It will be appreciated by those skilled in the art that the invention may be utilized within the context of any electronic interconnect that utilizes AC coupling.

Figure 1:
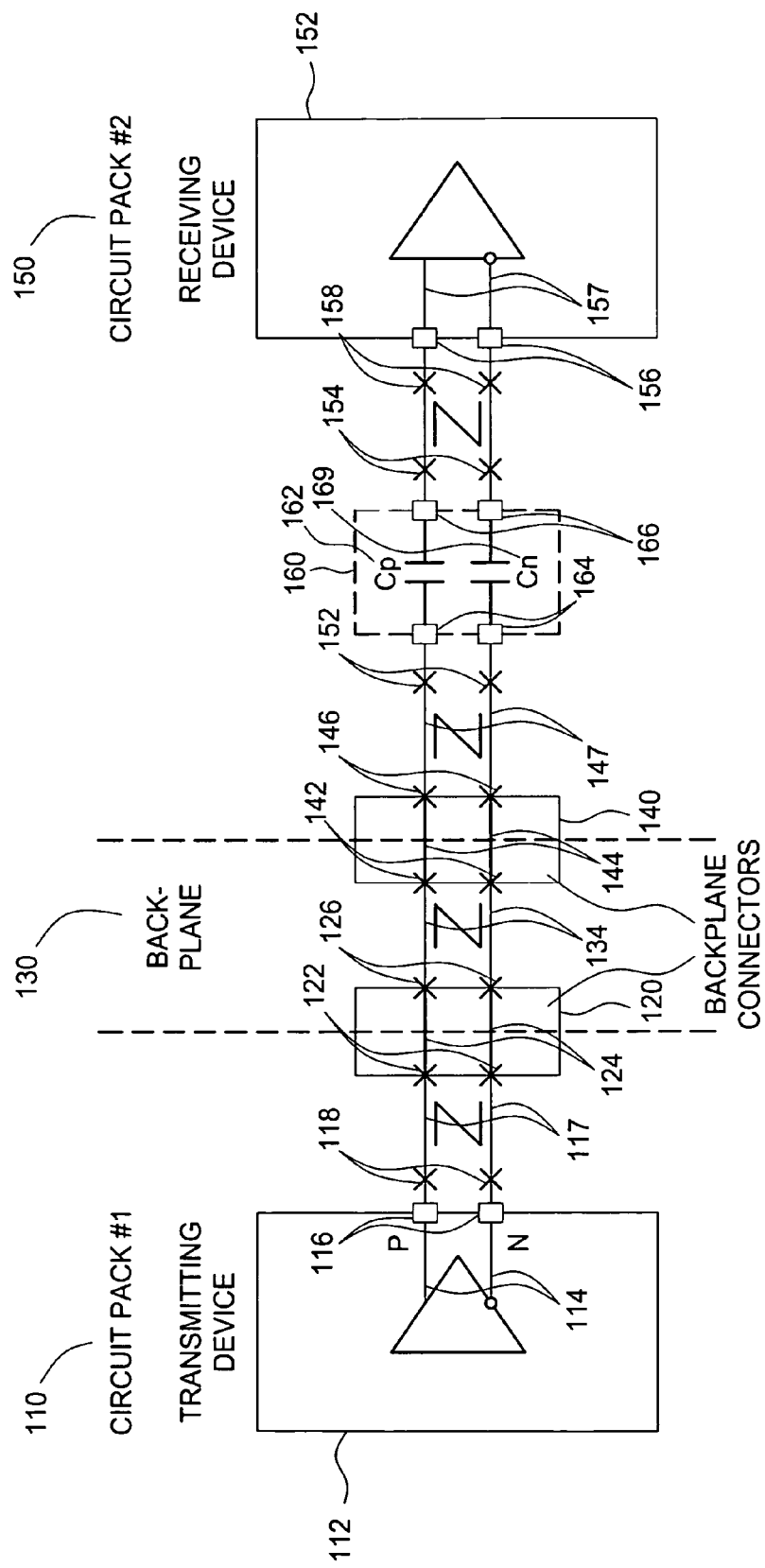
FIG. 1 depicts a high-level block diagram of a printed circuit board (PCB) having an AC coupled internal interface suitable for use with the present invention.

FIG. 1 depicts a high-level block diagram of a printed circuit board (PCB) having an AC coupled internal interface suitable for use with the present invention. The PCB 100 has a circuit pack #1 110, two backplane connectors 120 and 140, a backplane 130, a circuit pack #2 150 and a package 160 that has two coupling capacitors.

The circuit pack #1 110 includes a transmitting device 112 for transmitting a differential signal. The differential signal is an electrical signal having separate positive (P) and negative (N) portions. The differential signal is transmitted over a set of differential transmission lines 114. The P portion follows one trace and the N portion follows a parallel trace. The differential signal follows the traces and passes through a set of solder pads 116 and vias 118. The vias 118 are plated throughholes that connect top and bottom traces to traces in the inner layer. The vias 118 connect the transmission lines of the transmitting device to the transmission lines of the circuit pack #1 110. The differential signal continues on the circuit pack #1 110 through the differential pair transmission lines 117 to vias 122 and to the backplane connector 120.

The backplane connector 120 connects the differential signal from the vias 122 to the vias 126 through transmission lines 124. The differential signal through the backplane connector continues on the transmission lines of the backplane 130.

The backplane 130 includes differential transmission lines 134, which receives the differential signal from the transmitting device 112 through vias 126 and connects to the backplane connector 140 through vias 142.

The backplane connector 140 connects the differential signal from the vias 142 to the vias 146 through transmission lines 144. The differential signal traveling through the backplane connector continues on to the set of differential transmission lines 154 of the circuit pack #2 150.

The circuit pack #2 includes the set of differential transmission lines 147, the receiving device 152 and a package of two capacitors 160. The differential transmission lines 147 receive the differential signals through vias 152, which enters the package 160 through solder pads 164. The package has a capacitor Cp and a capacitor Cn. The positive portion of the differential signal passes through the capacitor Cp and the negative portion of the differential signal passes through the capacitor Cn. The capacitors function as an AC coupling interface. The differential signal then returns to the differential transmission lines 157 through solder pads 166 and vias 154. Upon reaching the receiving device 152, the differential signal passes through the vias 158 and the solder pads 156 to the receiving device 152.

In one embodiment, 100-ohm impedance is designed along the differential transmission links between the P path and N path from the transmitting device to the receiving devices. The backplane connectors, solder pads, and vias increase the undesirable effects added to the signals, but the impact on the system is minimized by utilizing techniques well known in the art.

In one embodiment, the package includes two ceramic capacitors having multiple layers as described below. The capacitors are separated by a gap of a distance approximately the same as the distance of the differential transmission link. Thus, the impedance between the two ceramic capacitors is approximately the same as the impedance between the two paths of the differential transmission links. The package including the two capacitors is designed with the appropriate gap between the Cp and Cn such that the impedance is kept the same all along the paths of the signals. Thus, the capacitance can be set without the need to be concerned with the size of the capacitors. Therefore, distortions in the impedance profile even for high bit rates are acceptable.

Figure 2A:
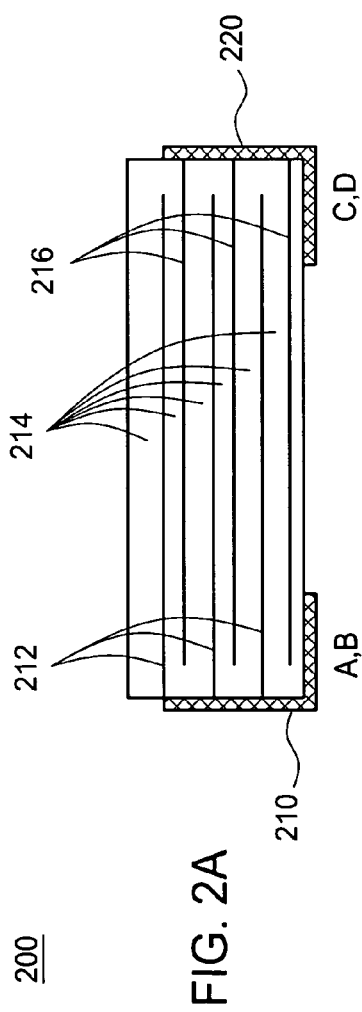
FIGS. 2(a), 2(b) and 2(c) depict the side, bottom and front views, respectively, of a high-level block diagram of a package having the coupling capacitors of the present invention.
Figure 2B:
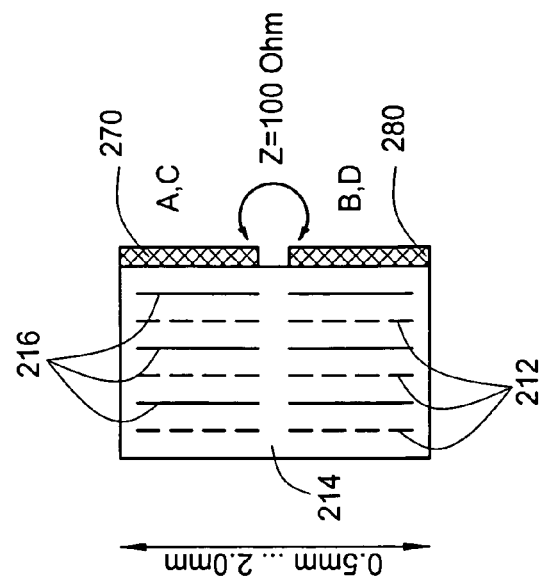
Figure 2C:
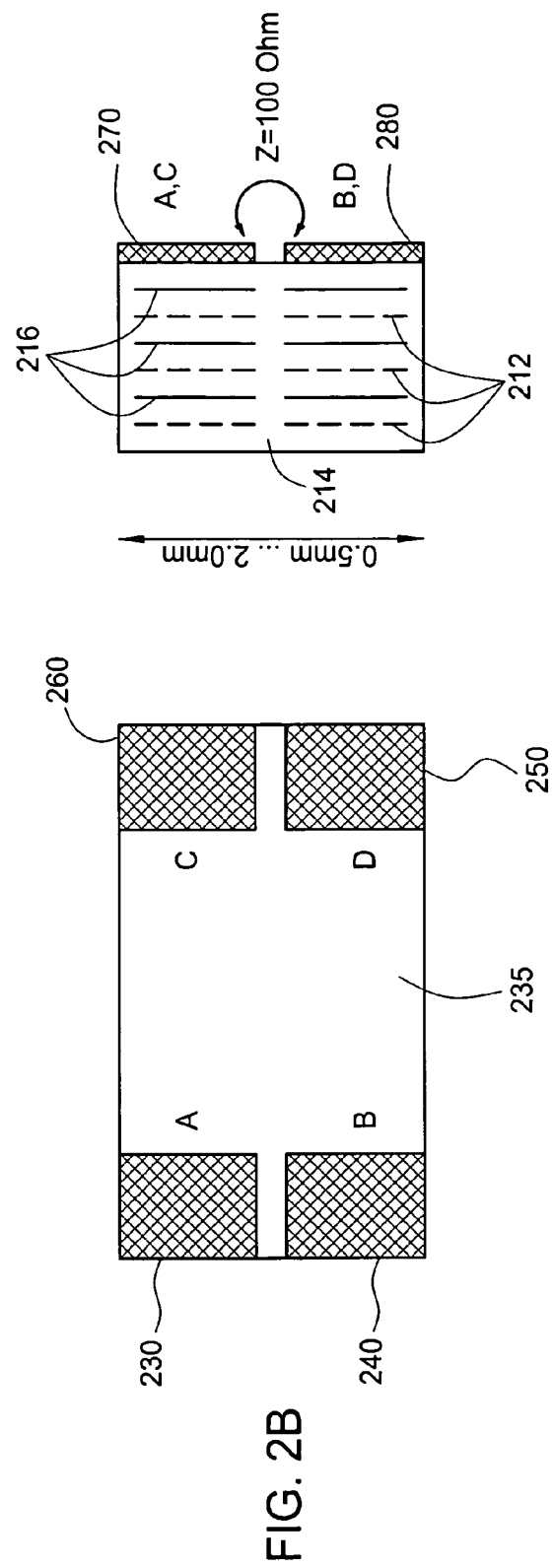

FIGS. 2(*a*), (*b*) and (*c*) depict the side, bottom and front views, respectively, of a high-level block diagram of a package having the coupling capacitors of the present invention. In one embodiment, the package of FIG. 2 is a surface mount device such as a mini-BGA. In another embodiment, the package is 8-pin QFN. In a further embodiment, the package is the standard 0603 with split pads. Other packaging techniques are possible.

The differential signal enters the package through solder pads A, B and exits the package at solder pads C, D. The transmission path between A and C functions as the capacitor for the positive portion of the signal and the transmission path between B and D functions as the capacitor for the negative portion of the signal. The material between the solder pads are multi-layered high-frequency ceramic having thin metallic surfaces. The details of the design of the package will be described below.

FIG. 2(*a*) depicts the side view of a high-level block diagram of the package having the coupling capacitors of the present invention. A first set of solder pads 210 receives a differential signal from the transmitting device. A plurality of metallic surfaces 212 are connected to the first set of pads 210 but not directly connected to a second set of pads 220. A plurality of metallic surfaces 216 are connected to the second set of pads 220 but not in direct contact with the first set of pads. A non-conductive high-frequency ceramic material 214 is layered between the metal surfaces. In one embodiment, the capacitance between the first set of pads and the second set of pads is 1 nF. In another embodiment, the capacitance between the two sets of pads is 50 nF. Any capacitance value is possible depending on the number of layers of ceramics and the length between the sets of pads. In addition, because lengths, the number of layers, and the dielectric constant of the ceramics can be varied, different geometries can result in the same capacitance value.

FIG. 2(*b*) depicts the bottom view of a high-level block diagram of the package having the coupling capacitors of the present invention. The package has four solder pads located at the four corners of the package. Solder pad A 230 is located at the upper left hand corner of the package. Solder pad B 240 is located on the lower left hand corner of the package. Solder pad C 260 is located in the upper right hand corner of the package. Solder pad D 250 is located in the lower right hand corner of the package. There is a large capacitance between pads A and C and pads B and D compared to the capacitance between pads A and B and pads C and D, which is set, in accordance with the mechanical dimensions and the dielectric constant of the ceramic material, to achieve a differential impedance of approximately 100 Ohms. That distance between pads A and B and pads C and D is usually between 100 to 300 micrometers. The interior 235 of the package contains materials that are multi-layered high-frequency ceramic having thin metallic surfaces as described above.

FIG. 2(*c*) depicts the front view of a high-level block diagram of the package having the coupling capacitors of the present invention. A positive set of solder pads 270 receives and sends the positive portion of the differential signal from the transmitting device. A plurality of metallic surfaces 212 are connected to the front portion of the package but not connected to back portion of the package. A plurality of metallic surfaces 216 are connected to the back portion of the package but not in direct contact with the front portion. A non-conductive high-frequency ceramic material 214 is layered between the metal surfaces. In one embodiment, the impedance between the positive set of pads and the negative set of pads is approximately 100 ohms. In another embodiment, the impedance between the two sets of pads is approximately 95 ohms. The impedance should be in the range of between 90 to 105 ohms. Any impedance value is possible depending on the spacing between pads A and C to pads B and D. In one embodiment, the geometry of this device is designed using a 3-D field solver program.

In another embodiment, ground layers (not shown) are included above and below the metallic surfaces. The ground layers lower the impedance and provide shielding. In a further embodiment, ground pads (not shown) are added along the sides of the package.

The geometry of the package is determined using:

$$Cp, Cn = \frac{\varepsilon_r \cdot \varepsilon_0 \cdot w \cdot l}{d} \cdot n \quad (1)$$

n=number of layers
d=thickness of layers
$\varepsilon_r$=relative dielectric constant
$\varepsilon_0$=absolute dielectric constant
w=width of capacitor structure
l=length of capacitor structure The absolute dielectric constant $\varepsilon_0$ is 8.85 pF/m. In one embodiment, the ceramic material has a relative dielectric constant $\varepsilon_r$ of 30 pF/m and a thickness of 25 E−6 m. For transmission of 10G, 8B/10B encoded binary signals, a capacitance needs to be at least 1000 pF. Different geometries are possible to achieve the desired capacitance. In one embodiment, each of the two capacitors is 0.5 mm high and 1.5 mm wide and has a length of 3.14 mm. The two capacitors are placed in parallel with a gap of about 0.7 mm in between them to achieve a differential impedance of about 100 ohms between the closest parallel sides. In this embodiment, the package is about 0.6 mm high, about 4 mm wide and about 3.5 mm long.

In another embodiment, in order to have approximately 100 nF capacity associated with the capacitors, a ceramic material with much higher $\in_r$ has to be used. The typical material for this range of capacity is approximately 2000 pF/m. This value is too high to get the desired 100-Ohms differential impedance with a reasonable gap size between the two capacitors within one package. In one embodiment, a hybrid stackup is used where different materials are used for the capacitors than the material for the gap between the capacitors.

FIGS. 3(a), 3(b) and 3(c) depict the side, bottom and front views, respectively, of a high-level block diagram of a package of the present invention having high coupling capacitance. The structure is similar to the package of FIG. 2 except a hybrid stackup is used. As can be seen by comparing FIG. 2 and FIG. 3, there are some differences between the two packages. One difference is the arrangement of the layers. Another difference is the ceramic materials used in the layers. Other differences to increase the coupling capacitance may be utilized.

FIG. 3 (a) depicts the side view of a high-level block diagram of the package having the high coupling capacitance of the present invention. A first set of solder pads 310 receives a differential signal from the transmitting device. A plurality of vertical metallic surfaces (not shown) are connected to the first set of pads 310 but not directly connected to a second set of pads 320. A plurality of metallic surfaces 316 are connected to the second set of pads 320 but not in direct contact with the first set of pads 310. A non-conductive vertical slab of high-frequency ceramic material 314 is layered between each of the metal surfaces. The ceramic material 314 is either a higher frequency ceramic material or a lower frequency ceramic material.

FIG. 3(b) depicts the top view of a high-level block diagram of the package having the high coupling capacitance of the present invention. The package has four solder pads located at the four corners of the package. Solder pad A 330 is located at the upper left hand corner of the package. Solder pad B 340 is located on the lower left hand corner of the package. Solder pad C 360 is located in the upper right hand corner of the package. Solder pad D 350 is located in the lower right hand corner of the package. There is a large capacitance between pads A and C and pads B and D compared to the capacitance between pads A and B and pads C and D, which is set, in accordance with the mechanical dimensions and the dielectric constant of the ceramic materials. The interior 235 of the package contains materials that are multi-layered high-frequency ceramic having thin metallic surfaces. The package includes layers of metallization, m12, m14, m16, m18, and m20, connected to pad A. The package also includes layers of metallization, m1, m3, m5, m7, and m9, connected to pad B. The package also includes layers of metallization, m1, m13, m15, m17, and m19, connected to pad C. The package also includes layers of metallization, m2, m4, m6, m8, and m10, connected to pad D. The package includes higher frequency ceramic material, d2-d10 and d12-d20. The package also includes lower frequency ceramic material, d1, d11 and d21.

FIG. 3(c) depicts the front view of a high-level block diagram of the package having the high coupling capacitance of the present invention. A positive set of solder pads 270 receives and sends the positive portion of the differential signal from the transmitting device. The package includes layers of metallization, m12, m14, m16, m18, and m20, connected to pad A. The package also includes layers of metallization, m1, m3, m5, m7, and m9, connected to pad B. The package also includes layers of metallization, m11, m13, m15, m17, and m19, connected to pad C. The package also includes layers of metallization, m2, m4, m6, m8, and m10, connected to pad D. The package includes higher frequency ceramic material, d2-d10 and d12-d20. The package also includes lower frequency ceramic material, d1, d11 and d21. Any impedance value is possible depending on the spacing between pads A and C to pads B and D. In one embodiment, the geometry of this device is designed using a 3-D field solver program.

While the forgoing is directed to various embodiments of the present invention, other and further embodiments of the invention may be devised without departing from the basic scope thereof. As such, the appropriate scope of the invention is to be determined according to the claims, which follow.

What is claimed is:

1. A passive microwave device adapted for use with a differential communication link, comprising:
   a package having two ceramic capacitors separated by a gap, the gap width being selected to provide a differential impedance of the capacitors matching an impedance of the components of the differential communication link and said package being adapted to conform to conductive paths forming the differential communication link.

2. The device of claim 1, wherein the differential impedance is within a range between 90 ohms and 105 ohms.

3. The device of claim 1, wherein the differential impedance is 100 ohms.

4. The device of claim 1, wherein the differential communication link transmits a differential signal at 10 GBits/s.

5. The device of claim 1, wherein the differential communication link transmits at a rate greater than 2.5 GBits/s.

6. The device of claim 1, further comprising a ground connection and an internal ground plane.

7. The device of claim 1, wherein each capacitor has multiple layers of high-frequency ceramic materials and metal surfaces.

8. The device of claim 1, further comprising a hybrid stackup, wherein materials for the capacitors are different from the material in the gap between the two capacitors.

9. The device of claim 1, wherein the two capacitors are placed in parallel within the package with a gap between the two closest sides of capacitors that achieves a differential impedance within a range between 90 ohms and 105 ohms.

10. A printed circuit board (PCB) having a high-speed differential AC coupling device, comprising:
   a transmitting device, for transmission of a differential signal;
   a backplane, having traces in the inner layer for transmission of the differential signal;
   the AC coupling device having two ceramic capacitors separated by a gap, the gap width being selected to provide a differential impedance of the capacitors matching an impedance of the components along the traces and said package being adapted to conform to conductive paths forming the traces; and
   a receiving device, for receiving the differential signal.

11. The PCB of claim 10, further comprising solder pads and vias.

12. The PCB of claim 10, wherein the differential impedance is the same as a PCB differential impedance from the transmitting device to the receiving device.

13. The PCB of claim 10, wherein the differential impedance is within a range between 90 ohms and 105 ohms.

14. The PCB of claim 10, wherein the differential signal is transmitted at 10 GBits/s.

15. The PCB of claim 10, wherein the differential signal is transmitted at a rate greater than 2.5 GBits/s.

16. The PCB of claim 10, wherein the AC coupling device further comprises a ground connection and an internal ground plane.

17. The PCB of claim 10, wherein the AC coupling device includes two capacitors, each capacitor having multiple layers of high-frequency ceramic materials and metal surfaces.

18. The PCB of claim 10, wherein the AC coupling device further comprises a hybrid stackup.

19. The PCB of claim 10, wherein the AC coupling device includes two capacitors that are placed in parallel within the device having a gap that achieves a differential impedance of between 90 ohms and 105 ohms between the two closest sides of the two capacitors.

20. A method, comprising:
connecting a high-speed AC coupler between a transmitting device and a receiving device for transmission of differential signals along a differential transmission link;
matching an impedance of the AC coupler such that the impedance is the same as the impedance of the rest of the differential transmission link; and
transmitting a high-speed differential signal from the transmitting device to the receiving device, wherein the AC coupler has two ceramic capacitors separated by a gap, the gap width being selected to provide a differential impedance of the capacitors matching an impedance of the components of the differential communication link and said AC coupler being adapted to conform to conductive paths forming the differential transmission link.

* * * * *